(12) United States Patent
Natarajan et al.

(10) Patent No.: US 6,190,477 B1
(45) Date of Patent: Feb. 20, 2001

(54) METHOD AND APPARATUS FOR PREPARING A RELEASE LAYER OF CERAMIC PARTICULATES

(75) Inventors: Govindarajan Natarajan, Pleasant Valley; Robert P. Kuder, II, Hopewell Junction; Francis R. Krug, Highland; Edward J. Pega, Hopewell Junction, all of NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/304,609

(22) Filed: May 4, 1999

(51) Int. Cl.[7] .......................... C03B 29/00; B32B 31/06; B05D 1/06
(52) U.S. Cl. ....................... 156/89.12; 156/273.1; 156/279; 156/289; 156/307.1; 427/475
(58) Field of Search ................... 156/89.11, 89.12, 156/273.1, 279, 289, 307.1; 427/475

(56) References Cited

U.S. PATENT DOCUMENTS

| | | | |
|---|---|---|---|
| 4,313,972 | 2/1982 | Goller et al. | 427/113 |
| 4,681,667 | 7/1987 | Utsumi et al. | 204/15 |
| 4,756,959 | 7/1988 | Ito et al. | 428/323 |
| 5,268,415 | 12/1993 | Pieterse et al. | 524/557 |
| 5,635,548 * | 6/1997 | Kittle et al. | 427/475 |

* cited by examiner

Primary Examiner—Michael W. Ball
Assistant Examiner—Michael A Tolin
(74) Attorney, Agent, or Firm—Steven Capella

(57) ABSTRACT

A process and apparatus are provided for preparing a release layer suitable for facilitating release of green ceramic laminates from a lamination fixture. The process comprises applying an electrostatic charge to at least one variably electrostatically chargeable portion of at least one lamination fixture and dispensing a layer of ceramic particulates, glass particulates or glass-ceramic particulates onto the charged portion of the lamination fixture to form a release layer on the lamination fixture. The apparatus provides a particulate dispenser for dispensing a layer of particulates of ceramic, glass, or ceramic-glass mixture, at least one lamination fixture having at least one variably electrostatically chargeable portion disposed in particulate receiving communication with the particulate dispenser; and a variable voltage electrostatic generator in electrical communication with the at least one chargeable portion of the lamination fixture.

25 Claims, 3 Drawing Sheets

METHOD AND APPARATUS FOR PREPARING A RELEASE LAYER OF CERAMIC PARTICULATES

BACKGROUND OF THE INVENTION

The present invention relates to the production of multi-layer ceramic laminates for electronics applications, and more particularly to a process and apparatus for preparing a release layer for releasing green ceramic laminates from a lamination fixture.

In the production of multi-layer ceramic parts such as multi-layer ceramic capacitors, a plurality of ceramic green sheets serve as platforms upon which chips, passive components, protective lids, and thermal enhancement hardware are attached. A plurality of ceramic green sheets, each patterned with conductive circuit layers interconnected by conductive vias, are precision stacked and compression laminated to each other. The green (pre-sintered) multi-layer ceramic laminate is then removed from the lamination plate for molding, cutting, and firing to obtain individual multi-layer ceramic sintered bodies. During this process, the green multi-layer ceramic laminate must be removed from the lamination plate without adverse consequences to the laminate such as damage caused by the laminate sticking to the lamination plate. One current process for facilitating removal of the ceramic laminate from the lamination plate comprises cutting a non-sticky material, such as polyethylene terephthalate film, to the desired dimensions, and placing the pre-cut film between the lamination plate and the stacked layers of ceramic green sheets prior to lamination. Such an approach is labor intensive, and as such, increases the production cost of the final product.

U.S. Pat. No. 4,756,959 to Ito et al. discloses a sheet for use in firing ceramic faced base plates comprising a combustible sheet such as pulp paper and a coating layer comprising a high melting point powder such as ceramic powder and a powder of carbon disposed on the combustible sheet. The sheet is cut to a desired size and placed between ceramic faced base plates which are stacked in a vertical direction during firing. The combustible sheet is incinerated during firing, leaving the powder of ceramics remaining between the ceramic faced based plates. This process is also time-consuming and expensive.

There is a need in the art for an improved process and apparatus for forming a release layer and facilitating release of green ceramic laminates from a lamination fixture after completion of the lamination process.

BRIEF SUMMARY OF THE INVENTION

The above-discussed and other drawbacks and deficiencies of the prior art are overcome or alleviated by the present process and apparatus for preparing a release layer suitable for facilitating release of green ceramic laminates from a lamination fixture. The process comprises applying an electrostatic charge to at least one variably electrostatically chargeable portion of a lamination fixture and dispensing a uniform layer of particulates of ceramic, glass, or ceramic-glass onto the charged portion of the lamination fixture to form a release layer on the lamination fixture.

The apparatus comprises a particulate dispenser for dispensing a preferably uniform layer of ceramic, glass, or ceramic-glass particulates; at least one lamination fixture having at least one variably electrostatically chargeable portion disposed in particulate receiving communication with the particulate dispenser; and a variable voltage electrostatic generator in electrical communication with the at least one variably electrostatically chargeable portion of the at least one lamination fixture.

BRIEF DESCRIPTION OF THE DRAWINGS

Referring now to the drawings wherein like elements are numbered alike in the several FIGURES.

DETAILED DESCRIPTION OF THE PREFERRED EMBODIMENTS

The present invention provides a process and apparatus for preparing a release layer suitable for facilitating release of green ceramic laminates from a lamination fixture. The process comprises applying an electrostatic charge to at least one variably electrostatically chargeable portion of a lamination fixture; and dispensing a layer of ceramic particulates onto the charged portion of the lamination fixture to form a release layer on the lamination fixture.

The apparatus comprises a particulate dispenser for dispensing a layer of ceramic particulates; at least one lamination fixture having at least one variably electrostatically chargeable portion disposed in particulate receiving communication with the particulate dispenser; and a variable voltage electrostatic generator in electrical communication with the at least one variably electrostatically chargeable portion of the lamination fixture.

Figure 1:
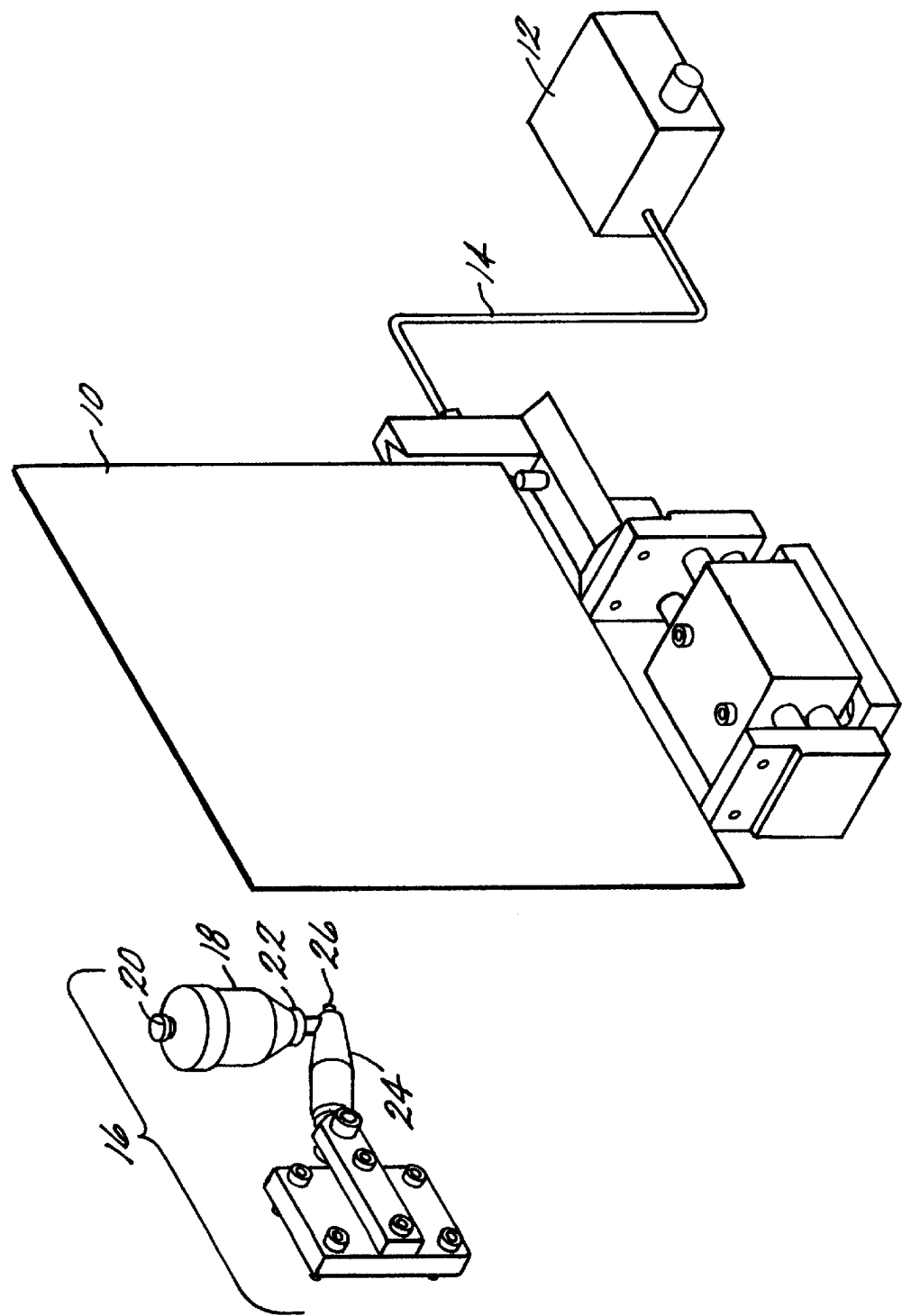
FIG. 1 is an illustration of an embodiment in accordance with the present invention of an apparatus for preparing a release layer for releasing green ceramic laminates from a lamination fixture.

Referring now to the drawings, there is illustrated in FIG. 1 a variably electrostatically chargeable lamination plate 10 which may be used in preparing a release layer according to one embodiment of the present invention. While the lamination fixture used in the present process and apparatus may take any form, the instant specification will discuss the lamination fixture in terms of a plate. It is understood that the present process and apparatus does not limit the form of the lamination fixture. The fixture may take any shape or configuration suitable for the particular application.

Lamination plate 10 is connected via electrostatic charge conduit 14 to variable voltage electrostatic generator 12. A desired voltage of electrostatic charge is applied to lamination plate 10 via conduit 14. The voltage intensity may be modified as desired to adjust the thickness and uniformity of the particulate layer.

The embodiment shown in FIG. 1 depicts lamination plate 10 having a uniform surface. However, alternate embodiments are within the scope of the present invention wherein portions of the lamination plate may be variably electrostatically chargeable and portions of the lamination plate may be composed of unchargeable material. The lamination plate, then, may be comprised of a combination of electrostatically chargeable and non-chargeable material, such as metal and non-metal. The release layer may thus be formed on selected areas of the lamination plate by controlling the area of charge on the plate.

Returning to the embodiment shown in FIG. 1, a particulate dispenser 16 is provided for dispensing a preferably uniform layer of particulates onto the at least one charged portion of the lamination fixture 10 to form a particulate release layer (not shown) on the charged portion of the lamination fixture 10. The particulate dispenser selected may be any particulate dispenser capable of discharging a stream of evenly distributed particulates 32 (shown in FIG. 4), for example the particulate dispenser sold by Badger Air Brush Company of Franklin Park, Ill. , Model 1OOLG, Gravity Feed Dual Action Internal Mix Air Brush. A venturi particulate dispenser is particularly advantageous for effecting discharge of a stream of evenly distributed particulates. Preferably, the particulate dispenser has a small discharge outlet opening. Preferably, the discharge outlet comprises a minimum opening of about 10 microns in diameter. Alternatively, the particulate dispenser may comprise a discharge outlet having a plurality of holes, slots, or other openings. The evenly distributed particulates discharged from the particulate dispenser 16 via discharge outlet opening 26 are attracted to the charged portion or portions of the lamination plate 10, forming a release layer (not shown) comprising a preferably uniform layer of particulates. Preferably, the thickness of the release layer is less than about 13 microns (about 0.5 mil), more preferably less than about 1 micron. Preferably, the thickness of the release layer varies less than abut 7 microns, more preferably less than abut 1 micron, most preferably, the release layer is of essentially uniform thickness.

FIG. 1 shows an embodiment wherein the particulate dispenser 16 comprises supply chamber 18 for holding a supply of ceramic particulates. Inlet orifice 20 is provided on supply chamber 18 for accepting a supply of ceramic particulate powder. Discharge orifice 22 has a connector disposed thereon (not shown) and is removably connected via the connector to particulate dispensing nozzle 24 comprising nozzle discharge outlet opening 26 for discharging the stream of evenly distributed ceramic particulates.

Ceramic, glass, and glass-ceramic particulates suitable for use in the present invention possess an average particle size of less than about 3 microns, preferably less than about 1 micron. Sub-micron sized ceramic particulates enhance the dispensing of an evenly dispersed stream of particulates from the particulate dispenser and therefore enhance the formation of a uniform release layer upon the lamination plate. The particulates used may be any ceramic, glass or glass-ceramic particulates that facilitate release and that will not have an undesirable effect on the green ceramic laminate upon sintering. Such particulates may be readily selected by one of skill in the art based upon the constitution of the green ceramic sheets to be laminated. Suitable ceramic, glass, and glass-ceramic particulates include, but are not limited to, on magnesium silicate, alumina, alumina with glass frits, aluminum nitride, aluminum nitride with sintering aids, boric acid, boron nitride, borosilicate glass, ferrite, silicon carbide, silicon nitride, glass ceramic, zirconia and combinations thereof. Significantly, the release layer is a thin powdery layer of particulate material which most preferably does not comprise any organic binder. The particulate powder may comprise additives known in the art, such as sintering aids.

The thickness of the release layer is preferably 13 microns (0.5 mil) or less, more preferably less than about 1 micron. The thickness of the release layer may be adjusted by any suitable means, for example by applying additional particulates, or by metering off a quantity of particulates using a metering rod, roller, brush, or a combination thereof.

Figure 2:
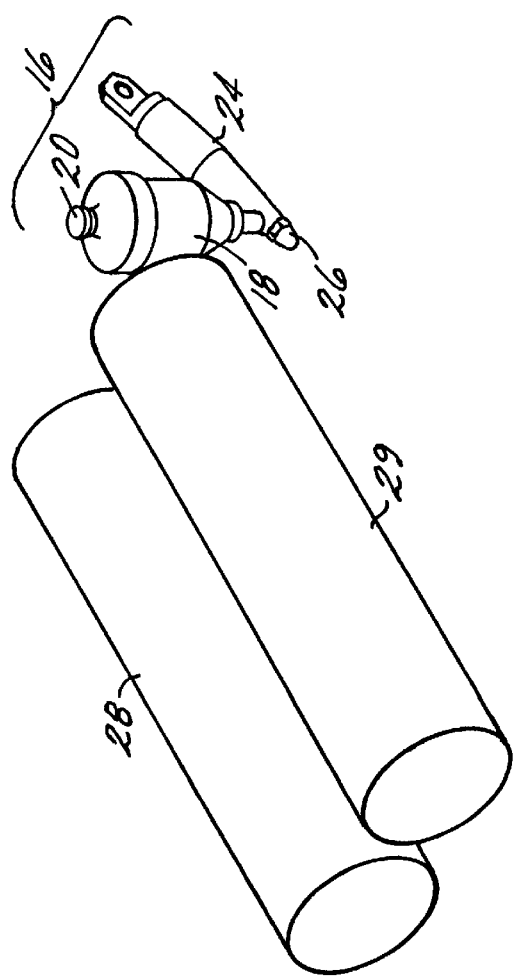
FIG. 2 is an illustration of an embodiment of a particulate dispenser and an adjusting device in accordance with the present invention.

Turning to FIG. 2, an embodiment is shown providing rollers 28 and 29 disposed so as to adjust the thickness of the release layer after dispensing thereof by particulate dispenser 16.

Figure 3:
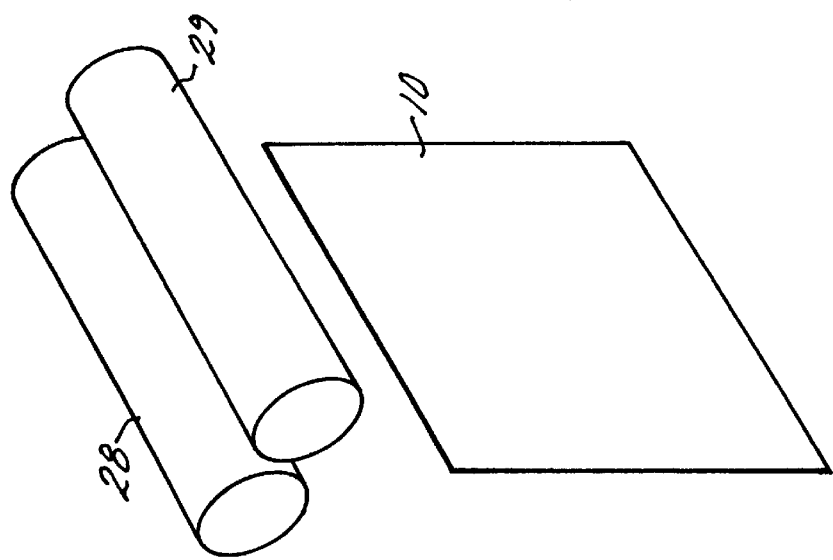
FIG. 3 is an illustration of an embodiment of an adjusting device situated above a lamination fixture in accordance with the present invention.

FIG. 3 shows rollers 28 and 29, which may be provided with a brush (not shown), positioned in relationship to lamination plate 10.

Figure 4:
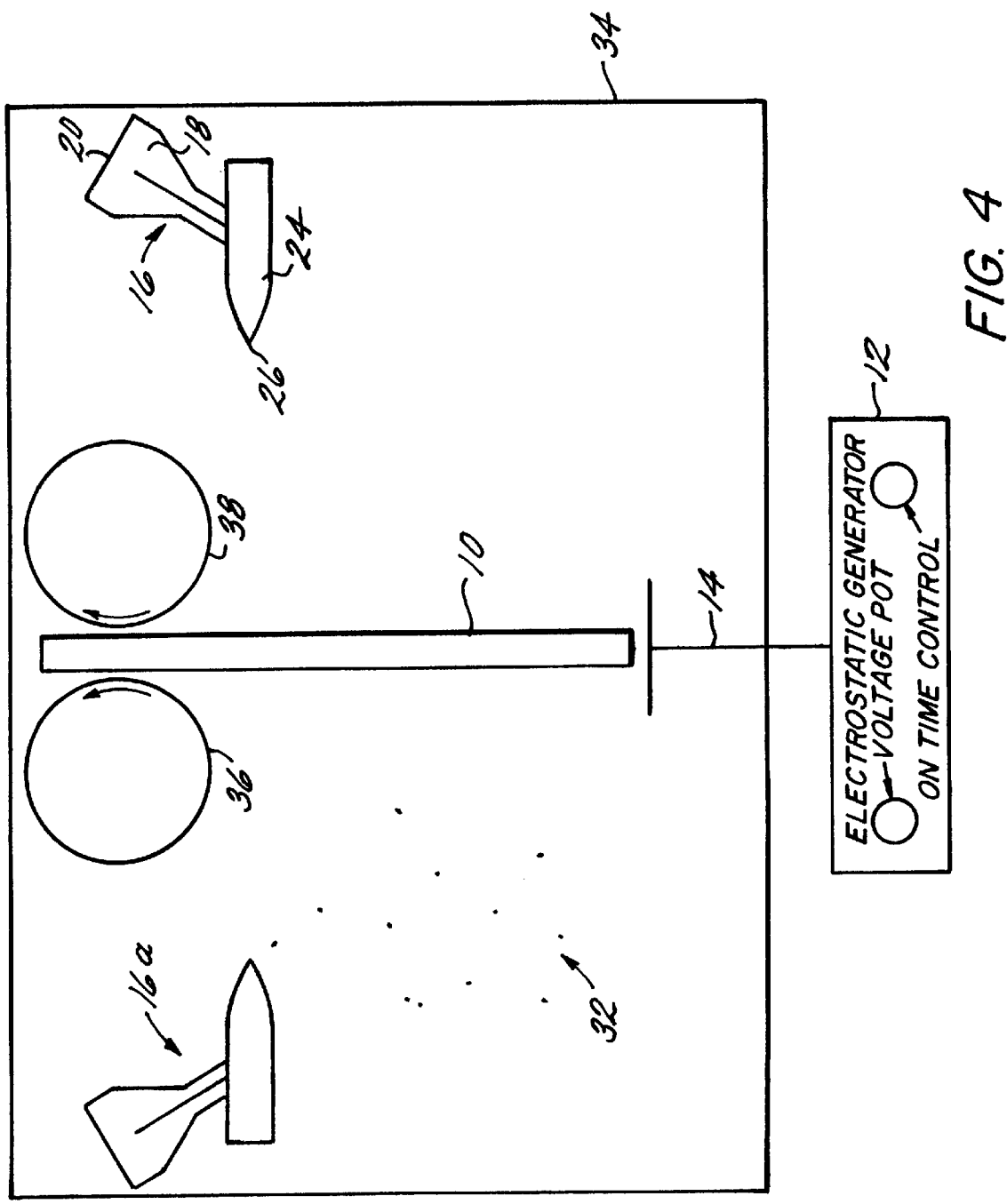
FIG. 4 is an illustration of an embodiment of an apparatus for preparing a release layer for releasing green ceramic laminates from a lamination fixture in a contained environment in accordance with the present invention.

In facilitating release of green ceramic laminates, a plurality of lamination fixtures, such as first and second lamination fixtures, may be provided for forming a laminate, wherein at least a portion of each of the lamination fixtures are variably electrostatically chargeable. The process comprises applying an electrostatic charge to at least one chargeable portion of each of the first and the second lamination fixtures and dispensing ceramic, glass, or glass-ceramic particulates onto the charged portions of the first and the second lamination fixtures to form release layers on each fixture, the release layers comprising uniform layers of particulates. Alternatively, a release layer may be provided on two surfaces of a single lamination plate. FIG. 4 shows an embodiment wherein lamination plate 10 is disposed in particulate receiving communication with particulate dispensers 16 and 16a, so as to enable formation of release layers (not shown) on two opposite surfaces of lamination plate 10. The process further comprises disposing a plurality of ceramic green sheets between the release layers provided on the first and the second lamination fixtures, and laminating pressure sources and applying laminating pressure to form a ceramic laminate. In the embodiment shown in FIG. 4, pressure rollers 36 and 38 are provided to apply laminating pressure to the ceramic green sheets. Typically, the lamination process also involves applying heat. The release layers are partially or fully transferred to the ceramic laminate during the lamination process. The ceramic laminate may then be removed from the lamination fixtures. The removal of the ceramic laminate from the lamination fixtures may be facilitated by reducing or eliminating the electrostatic charge on the lamination plate.

Preferably, the process is conducted in a controlled environment to avoid contamination of the release layer, ceramic green sheets, and laminate. FIG. 4 shows an embodiment wherein the apparatus is contained in an environmentally controlled enclosure 34.

While preferred embodiments have been shown and described, various modifications and substitutions may be made thereto without departing from the spirit and scope of the invention as defined in the appended claims. Accordingly, it is to be understood that the present invention has been described by way of illustration and not limitation.

What is claimed is:

1. A process for preparing a release layer for facilitating release of green ceramic laminate from a lamination fixture comprising:

applying an electrostatic charge to at least one variably electrostatically chargeable portion of a lamination fixture; and dispensing particulates selected from the group consisting of ceramic particulates, glass particulates and glass-ceramic particulates onto the charged portion of the lamination fixture to form a release layer of ceramic particulates on the lamination fixture.

2. The process of claim 1, wherein the dispensing is with a venturi particle dispenser.

3. The process of claim 1, wherein the particulates have an average particle size of less than about 1 micron.

4. The process of claim 1, wherein the particulates are selected from the group consisting of magnesium silicate, alumina, alumina with glass frits, aluminum nitride, aluminum nitride with sintering aids, boric acid, boron nitride, borosilicate glass, silicon carbide, silicon nitride, glass ceramic, zirconia and combinations thereof.

5. The process of claim 1, further comprising:
adjusting the thickness of the release layer by modifying the electrostatic charge applied to the at least one portion of the lamination fixture.

6. The process of claim 1, further comprising:
adjusting the thickness of the release layer by a method selected from the group consisting of applying additional ceramic particulates and metering off a quantity of ceramic particulates.

7. The process of claim 6, wherein the adjusting is with at least one metering roller, at least one brush, or a combination thereof.

8. The process of claim 1, wherein the thickness of the release layer is less than about 1 micron.

9. The process of claim 1, wherein the thickness of the release layer varies less than about 1 micron.

10. The process of claim 1, further comprising conducting the process in an environmentally controlled enclosure.

11. The process of claim 1, wherein the release layer is fully or partially transferred to the laminate in a lamination process.

12. A process for facilitating release of green ceramic laminate from a lamination fixture comprising:
applying an electrostatic charge to at least one variably electrostatically chargeable portion of a first lamination fixture and at least one variably electrostatically chargeable portion of a second lamination fixture; and
dispensing particulates selected from the group consisting of ceramic particulates, glass particulates, or ceramic-glass particulates onto the charged portions of the first lamination fixture and the second lamination fixture to form release layers on the charged portions of the first lamination fixture and the second lamination fixture;
disposing a plurality of ceramic green sheets between the release layers of the first lamination fixture and the second lamination fixture; and
applying laminating pressure and heat to form a ceramic laminate.

13. The process of claim 12, wherein the release layers are fully or partially transferred to the ceramic laminate.

14. The process of claim 12, wherein the dispensing is with a venturi particle dispenser.

15. The process of claim 12, wherein the particulates have an average particle size of less than about 1 micron.

16. The process of claim 12, wherein the particulates are selected from the group consisting of magnesium silicate, alumina, alumina with glass frits, aluminum nitride, aluminum nitride with sintering aids, boric acid, boron nitride, borosilicate glass, silicon carbide, silicon nitride, glass ceramic, zirconia and combinations thereof.

17. The process of claim 12, further comprising adjusting the thickness of at least one of the release layers by modifying the electrostatic charge applied to at least one portion of at least one of the lamination fixtures.

18. The process of claim 12, further comprising:
adjusting the thickness of at least one of the release layers by a method selected from the group consisting of applying additional particulates and metering off a quantity of particulates.

19. The process of claim 18, wherein the adjusting is with at least one metering roller, at least one brush, or a combination thereof.

20. The process of claim 12, wherein the thickness of each of the release layers is less than about 1 micron.

21. The process of claim 12, wherein the thickness of each of the release layers varies less than about 1 micron.

22. The process of claim 12, further comprising removing the ceramic laminate from the lamination fixtures.

23. The process of claim 22, further comprising reducing the electrostatic charge on at least one of the lamination fixtures to facilitate removal of the ceramic laminate.

24. The process of claim 22 further comprising eliminating the electrostatic charge on at least one of the lamination fixtures to facilitate removal of the ceramic laminate.

25. The process of claim 12, further comprising conducting the process in an environmentally controlled enclosure.

* * * * *